United States Patent [19]

Fleming, Jr. et al.

[11] 4,331,462

[45] May 25, 1982

[54] OPTICAL FIBER FABRICATION BY A PLASMA GENERATOR

[75] Inventors: James W. Fleming, Jr., Fanwood; John B. MacChesney, Lebanon; Paul B. O'Connor, Plainfield, all of N.J.

[73] Assignee: Bell Telephone Laboratories, Incorporated, Murray Hill, N.J.

[21] Appl. No.: 143,834

[22] Filed: Apr. 25, 1980

[51] Int. Cl.³ .............................................. C03B 37/07
[52] U.S. Cl. ...................................... 65/3.12; 427/39; 427/163
[58] Field of Search .................. 65/3 A, 3.12; 427/39, 427/163, 231, 237

[56] References Cited

U.S. PATENT DOCUMENTS

| | | | |
|---|---|---|---|
| 4,125,389 | 11/1978 | King | 65/3 A |
| 4,145,456 | 3/1979 | Küppers et al. | 65/3 A X |
| 4,217,027 | 8/1980 | MacChesney et al. | 65/3 A X |
| 4,262,035 | 4/1981 | Jaeger et al. | 427/39 |

FOREIGN PATENT DOCUMENTS 2328930 1/1974 Fed. Rep. of Germany .

*Primary Examiner*—Richard V. Fisher
*Attorney, Agent, or Firm*—George S. Indig

[57] ABSTRACT

Optical fiber preforms are produced by means of a duplex hot zone, a section of which is defined by an r.f. generated plasma fire ball. The process operates within a tube with gaseous precursor material reacting within the hot zone to result in deposited material of the desired preform glass composition. A "smoothing" region within the hot zone is defined by tube surface at a temperature sufficiently elevated to consolidate any particulate material resulting from reaction. In some aspects, the disclosed procedures may be regarded as Modified Chemical Vapor Deposition. Commercial significance resides in significantly increased throughput of preforms and, consequently, in fiber.

30 Claims, 1 Drawing Figure

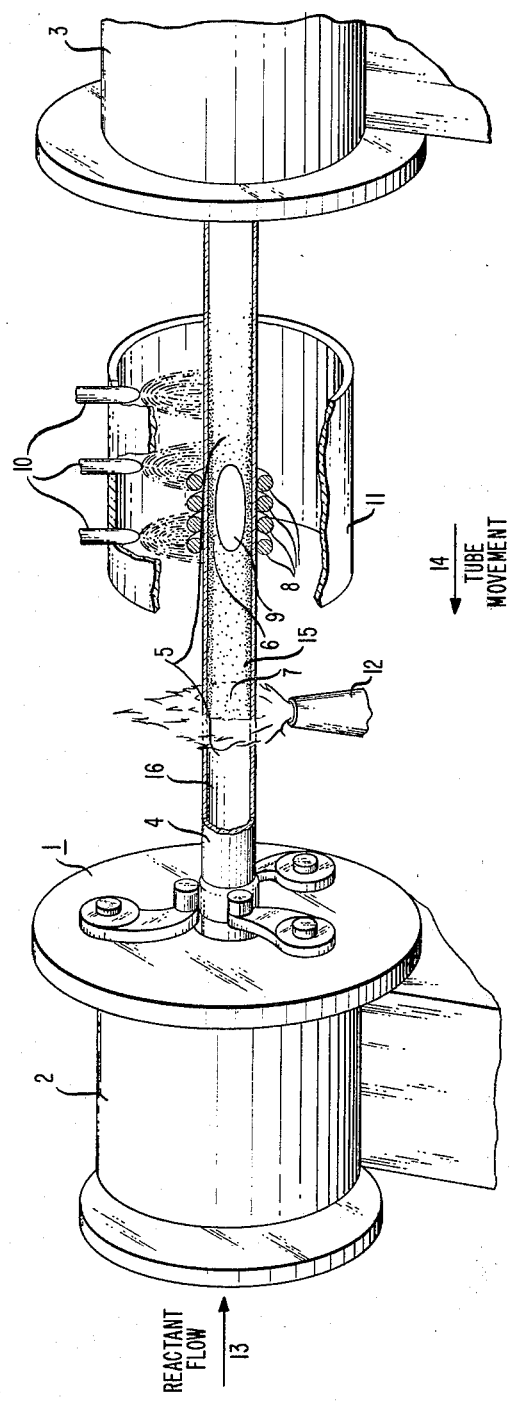

OPTICAL FIBER FABRICATION BY A PLASMA GENERATOR

BACKGROUND OF THE INVENTION

1. Field of the Invention

The invention is concerned with fibers for use as transmission lines in communication systems operating in the visible or near visible spectra. Such fibers have come to be known as "optical fibers." At the present state of the art, optical fibers are generally glassy—usually based on silica. Forms in use or contemplated for use may be multimode with transmitting core regions many wavelengths in diameter or may have smaller dimensioned cores designed to support only the fundamental mode or a limited number of modes. In either event, fibers, which generally include a clad of relatively low refractive index, and are of an overall dimension of the order of 100 micrometers are drawn from a relatively massive starting body which in terms of composition and refractive index is a large-scale replica of the final fiber. The field of the invention concerns preparation of optical fiber with a particular view to the precise manner in which a starting body or "preform" is prepared.

2. Description of the Prior Art

Lightwave communications involving transmission through optical fiber is fast becoming a significant commercial factor. Trial installations in several countries are in regular use carrying such services as voice, data, and video. Systems may span distances of many kilometers or may involve shorter spacings. Broad band glass fiber systems enjoy cost and/or space advantage relative to copper conductor. Other factors, significant in narrow band and also in short haul use include low weight, radiation—resistance, immunity from electrical interference, and electrical isolation of connected terminals.

While design changes continue to evolve, general fiber configuration is likely to remain unchanged. In such general terms, fibers include a "core" region and an enveloping "clad" region which, depending upon fabrication, may sandwich an intervening "barrier" layer.

Multimode communication fiber designed for use over kilometer distances, is, in accordance with one set of standards, of an outer diameter of 125 micrometers ($\mu$m) with a core diameter of 50 $\mu$m. An intervening barrier layer is of a thickness of a few $\mu$m-perhaps 5 $\mu$m. As presently manufactured, this fiber is largely silica. Light guiding qualities are due to an increased refractive index within the core with such increase generally due to doping by a dopant of greater polarizability than that of silica. At this time the primarily dopant is germania. Other compositional variants are responsive to other considerations; and so phosphorus oxide, $P_2O_5$, is often introduced into core, clad, and barrier as well to decrease viscosity and so serve as a processing aid. Barrier composition, as the term implies, is designedly such as to block introduction of unwanted contaminant into the core. Such compositional considerations, all exemplary, only, are described in 62, No. 9 *Proc. IEEE*, 1278 (1974).

Fiber dimensions are those of "multimode" fiber. At usual carrier wavelengths, generally from 0.8 to 0.9 $\mu$m and also at contemplated longer carrier wavelengths centering about 1.3 or 1.6 $\mu$m, the core is sufficiently large to support thousands of modes. These different modes have different group velocities so that packets of information, generally digital, are composed of many modes traveling at different speeds to result in packet spreading or, for digital communications, in pulse spreading. Multimode fibers designed for use over kilometer distances have cores of radially reducing refractive index designed to lessen this "mode dispersion." See, for example, 52 *Bell System Technical Journal*, 1563 (1973). This profiled multimode fiber is responsible for the relatively large bandwidth capability of present optical fiber. Operating systems are based on bandwidths of 40-50 megabits/sec. or greater over distances of 10 kilometers or more. Such transmission capacity requires precise control of material concentration gradients responsible for desired refractive index profiles.

It is the general expectation that the trend away from multimode fiber and toward single mode fiber will continue. Mode dispersion is limiting in usual high bandwidth multimode systems. Use of single mode structures takes advantage of low insertion loss values attainable in glass fiber and permits longer inter-repeater spacing. Election of single mode is cost-dependent. Cost factors involve demands placed on terminal equipment, on splicing, and on other design considerations required to accommodate relatively small core dimensions. Initial single mode fiber installations are those in which a premium is placed on maximization of repeater spacings. The primary candidate is for underwater communications use. Longer carrier wavelengths, e.g. in the region of 1.3 $\mu$m or even 1.55 $\mu$m, inherently permit lower insertion loss and are of particular significance in single mode fiber systems which may be loss- rather than dispersion-limited.

The 1.3 $\mu$m wavelength is of particular interest because of very small velocity-wavelength dependence which characterizes usual silica-based materials. This low "material dispersion"—the bulk manifestation descriptive of pulse spreading due to variation in group velocity for different wavelengths—is the result of the crossover between normal and anomalous dispersion wavelength regions. The longer wavelength region at 1.55 $\mu$m is characterized by a nonzero anomalous material dispersion which to some extent may offset still smaller realizable values of insertion loss. Fiber may, however, be designed to compensate for this anomalous material disperson by "normal" waveguide dispersion so that systems may take advantage of lower insertion loss. Such fibers depend on core dimensions and index values approaching cutoff for second mode. See 15, No. 12, *Electronics Letters*, 334-335 (1979).

Insertion losses for fibers traversing distances of kilometers or greater are, in terms of a decade ago, incredibly small. Fiber installations operating at ~0.82 $\mu$m may evidence insertion loss of about 3 db/km. Reported losses for experimental fiber are at 0.5 db/km and 0.2 db/km for wavelengths of 1.3 $\mu$m and 1.55 $\mu$m, respectively. Extrinsic contributions to insertion loss for the fiber are considered largely due to contaminants— primarily OH. Fabrication techniques are at an advanced level and provide for contaminant exclusion to ppm and better. Close dimensional and composition control are realized as well.

A prevalent fabrication approach involves preparation of a "preform" followed by fiber drawing from a heated tip. In accordance with this procedure, the preform is a solid rod prepared by Modified Chemical Vapor Deposition. See U.S. patent application Ser. No.

828,617, filed Aug. 29, 1977, now U.S. Pat. No. 4,217,027. In a common variant of MCVD, precursor gases, including SiCl4 and GeCl4, are introduced as a flowing stream into a tube with a traversing reaction hot zone produced by an external heat source. As practiced, heating is by an oxyhydrogen torch which traverses and retraverses the rotating MCVD tube to result in reaction. Particulate material is carried downstream and is deposited on the tube wall. Deposited particles are consolidated within the hot zone as it advances to produce a smooth, transparent glassy layer. The sequence is repeated many times to result in sufficient buildup of layers of appropriate refractive indices (either consistent or varying) to yield solid preform of desired index profile upon collapse. Replica fiber is then produced by drawing.

This MCVD process is in worldwide use and has resulted in the low insertion loss measurements reported in this description. Low insertion is, in part, attributed to the protected environment of the hot zone which is isolated from the usual combustion heating source so that water of combustion is avoided. The layer-by-layer nature of the process permits close profile control so that bandwidths of gigahertz-kilometer are attained in multimode systems. MCVD has been used for fabrication of single mode fiber as well as multimode fiber.

While the MCVD product is already economically viable, further cost reduction is sought. A promising avenue is increasing preform throughput. A number of parameters contribute to preform throughput, and design advances have resulted in shortened collapse time, in more rapid retraversal, etc. The parameter which has received the most attention, however, is that of reaction and deposition rate.

When MCVD was first introduced, it was clearly deposition-rate limited. Reactant flow under operating conditions resulted in large volumes of particulate matter but in relatively small capture. Under most conditions more reaction product was exhausted then deposited. Studies directed to increased deposition at first identified a mechanism and then yielded increased deposition rates. In accordance with the mechanism, "thermophoresis," particles follow a temperature gradient in the direction of the relatively cool support tube wall. See 50 *Journal of App. Phys.*, 5676 (1979). U.S. patent application Ser. No. 080,483, filed Oct. 1, 1979, now U.S. Pat. No. 4,263,032 describes process variables enhancing deposition through thermophoretic means. An embodiment depends on an enhanced thermophoretic drive field produced by water-cooling the tube downstream of the hot zone. See U.S. patent application Ser. No. 143,845, (Mac Chesney et al 26-1-1), filed Apr. 25, 1980, now U.S. Pat. No. 4,302,230.

An approach to increased reaction rate in MCVD processing is described in U.S. patent application Ser. No. 128,094, filed Mar. 7, 1980, now U.S. Pat. No. 4,262,035. In this MCVD species, an r.f. plasma heat source yields a luminous "fire ball" with temperatures of thousands of degrees centigrade. High reaction rates are permitted, and increased deposition efficiency is ascribed to steep temperature gradients. Unlike flame MCVD, conditions have permitted high reaction rates while avoiding visible particulate matter in the exhaust. A process described as using a microwave plasma in an evacuated chamber is in use in Europe for making fiber preforms. Rates are limited in this plasma Chemical Vapor Deposition process by low reactant introduction rate corresponding with evacuation (Küppers et al, Technical Digest International Conference Integrated Optics, Optical Fiber Communication—Tokyo, Japan, page 319, 1977).

The "high pressure plasma work" of U.S. application Ser. No. 128,094 supra (in examples open tube end corresponds with ambient atmosphere so that flowing streams in such examples are considered to be atmospheric) permits homogeneous gas phase reaction to yield particulate product in common with other MCVD processes. This is to be distinguished from the rate-limiting heterogeneous wall reaction which characterizes the CVD process as previously practiced in the fabrication of optical fiber (true also of the plasma CVD process). Early promise for high pressure plasma processing has provoked further experimental work. Results have been disappointing. Insertion loss at 0.82 $\mu$m has not been below 10 dB/km for high throughput (approaching 1 gm/min deposition). Insertion loss has in general been at levels considered satisfactory for contemplated long-haul communication purposes only at deposition rates attainable in flame MCVD (<5 dB/km for 0.82 $\mu$m at <0.5 gm/min). It is commonly thought that plasma MCVD is inherently characterized by a relatively lossy product—a product unsatisfactory for spanning contemplated 10 km or greater interrepeater spacings. See Third European Conference on Optical Fiber Transmission, Munich, p. 15 (1977).

SUMMARY OF THE INVENTION

The invention provides for the fabrication of low insertion loss optical fiber (<10 dB/km at 0.82 $\mu$m) at high throughput rates (>1.0 gm/min). In preferred embodiments loss is <5 dB at >1.0 gm/min and <10 dB at >2 gm/min always for 0.82 $\mu$m. Particular embodiments are regarded as species of MCVD as described in U.S. patent application Ser. No. 828,617, filed Aug. 29, 1977, now U.S. Pat. No. 4,217,027. That disclosure describes processing and product variables applicable to this invention as well. The present invention is, in many respects, manipulative in nature and imposes few requirements on product. The essence of the advance is high throughput of low insertion loss fiber. Multimode fiber as well as single mode fiber is prepared more quickly than by flame MCVD. Measured loss is sufficiently low to permit use in contemplated long-haul systems.

Processing may be carried out in equipment quite similar to that utilized in flame MCVD; however, with specific constraints placed on the nature and operation of the heat source. The heat source is such as to result in a "tandem hot zone," regarded as being constituted of at least two regions. While the entire tandem hot zone is usually at sufficiently high temperature to permit homogeneous reaction, only one of the two regions has sufficiently high wall temperature to permit smoothing of deposited material. A relatively cool wall in another region results from a localized and well-stabilized plasma "fire ball," ordinarily centrally located within the tube and encompassed by an annular region of relatively low luminosity. While for expediency the plasma may be struck in argon and other medium which is easily brought to self-sustaining plasma condition, steady state operation in a preferred embodiment contemplates a diatomic or other polyatomic gas which, for silica compositions, may include oxygen. In general, the two regions are contiguous and traverse at similar or identical velocity relative to the tube. A number of variants involve: the order of the regions relative to the gas stream direction as well as inclusion of additional regions; cooling means, e.g., for plasma stabilization, imposition of thermophoretic fields, etc. While plasma heat sources will likely take the form of r.f. generators, appropriate plasma operating conditions are more generally defined in terms of necessary high pressure operation. Regardless of the nature of the heat source, high throughput, as contemplated, requires pressures of at least a significant fraction of an atmosphere (0.1 or preferably 0.25 or 0.5 atmosphere). A constrained, centered plasma is also required. A minimum requirement is presence of polyatomic gas molecules in a region encompassing the fire ball with concentration of such molecules in the region being greater than within the fire ball. In preferred embodiments, this requirement is met by sustaining the plasma by such molecules at least in part so that the fire ball contains ionized species—usually ionized monatomic species—corresponding with the molecules species. A preferred embodiment depends upon an "oxygen plasma."

BRIEF DESCRIPTION OF THE DRAWING

The FIGURE is a perspective view partly in section representative of processing after attainment of steady state conditions in accordance with an embodiment of the invention.

DETAILED DESCRIPTION

1. Glossary and General Operating Conditions

Many terms in the lightwave communication art have taken on meanings which differ from ordinary scientific usage. Other general terms are assigned meanings of relatively specificity. A glossary of such terms serves as an index to prescribed operating parameters:

Plasma

For the inventive purposes, a mass of fluid material resembling a vapor in physical properties but containing ionized matter, generally of approximately zero net charge as sustained by an electrical discharge. Its electrical conductivity is high relative to a corresponding minimized vapor.

High Pressure Plasma

A plasma as sustained within a gaseous ambient at a pressure equal to at least 0.1 and preferably 0.25 or even 0.50 atmosphere. This is to be distinguished from low pressure plasma generally maintained at a few mm of Hg.

r.f.

Generally refers to electromagnetic radiation of radiative properties satisfactory for use in long-haul communications in free space. In the plasma arts the term distinguishes from "microwave" which contemplates wavelengths sufficiently small to be supported within a cavity of reasonable dimensions. For the purposes of the present description, r.f. is intended to include electromagnetic radiation which may be generated by an r.f. coil plasma generating equipment. For many purposes, an approximate frequency range of from 1 to 100 MHz is contemplated.

Microwave

As defined above, contemplated wave energy is supportable in a cavity and may be considered to be of the general frequency range of 100 MHz and higher. The invention does not, in a fundamental sense, rely upon the nature of the plasma generating equipment nor on the wavelength of the radiation although both parameters are of design consequence.

Oxygen Plasma, Argon Plasma (or other compositionally identified plasma)

This terminology refers to the total species (ionized and neutral) within the plasma. In general terms a plasma is here defined as, e.g., an oxygen plasma if the majority of species within the plasma is oxygen. The nature of the plasma is determined in part by the ease of ionization; in part by lifetime of ionized species. Ambient composition may therefore vary from plasma ion composition. The ambient gas composition is nevertheless a reasonable approximation of the total plasma composition in terms of mol or weight % since only a small fraction of gas is ionized. A significant deviation of plasma from ambient results from thermal dissociation of any polyatomic species. This is significant in terms of a preferred embodiment.

Steady State Plasma

As contemplated, this terminology refers to the plasma subsequent to initiation. It is a requirement of a preferred embodiment that the steady state plasma be suitable diatomic gas plasma as defined.

Initial Plasma

This is the plasma at initiation, ordinarily as produced by discharge across an easily ignited medium such as argon. Where the term "plasma" is used without either modifier (rather than by "initial plasma" or "steady state plasma"), the latter is contemplated.

Fire Ball

This is the luminous region within the plasma as visually observable. In accordance with the inventive teaching, suitable fire balls are separated from the tube wall by an annular region which is usually nonluminous but may evidence molecular or other luminosity always at lower intensity than that of the fire ball.

Annulus or Annular Region

This is the nonluminous or less luminous region which surrounds the fire ball as described above. It is bounded at its minor circumference by the fire ball. (By way of illustration, interfacial temperature as indicated by spectroscopic techniques in a particular example is found to be ~5000° C.)

The conditions implicit in the above description are necessary to the operation of the invention. During steady state, the fire ball must be approximately centrally located within the support tube. Such axial placement and maintenance is, in principle, easily attained. Considering the fire ball in dynamic terms, i.e., in terms of continuously occurring recombination events and ionization events, it is seen that, in principle, the rate of ionization events is equal about the periphery of the fire ball only when it is symmetrically located within the tube. The implicit requirement is that the tube wall, in fact, represents an equi-energetic boundary in all relevant energetic terms so that relevant drive forces in all radial directions are identical.

Under ideal conditions, symmetrical (axial) location within the tube corresponds with least heat loss from the fire ball to the tube walls. Attainment of this naturally "stable" position is defeated in many instances by perturbations from energy symmetricity. Examples of perturbation include temperature variations about the periphery of the tube, as well as perturbation in the electric field produced by the usual electrical (rf or microwave) energy. An additional perturbation in the instance of the usually horizontally disposed tube is due to gravity. Other perturbations entail electron capture cross-sections, likelihood of elastic, as well as inelastic, collisions which may extract energy from electrons, thereby reducing electron temperatures—in short, any perturbation resulting in inequality in the number of ionization events about the fire ball periphery as physically centrally located. All perturbations assume the greater significance within Zone I in which the requirement of relatively cool inner walls gives rise, in turn, to a need for a thick annulus—an annulus which, in usual instances, is of a thickness of a centimeter or greater.

Centering of the fire ball to attain stability with the relatively small fire ball—inner tube diameter ratio required to attain the specified characteristics for Zone I is accomplished by fortification of the drive forces which tend to stabilize a plasma created largely from a monatomic gas species ambient. The prime example is, of course, argon—the medium in which high pressure plasma workers generally operate.

It is seen that the super-imposed drive force must be such as to offset energy perturbations tending to make physical and energetic symmetrical locations disparate. Such a contribution may take a number of forms. It may, for example, be electrical, with sensing and feedback means designed to result in local field intensities and thereby restore the fire ball to a central position. A less elegant but expendient approach consists of imposition of symmetrical drive forces of sufficient magnitude to mask or overwhelm the perturbed forces which would prevent central location. An example, whose efficacy is largely explainable in terms of the second option, involves the familiar laminar flow of sheath gas attained by means of nozzle so directed as to produce tangential introduction.

A preferred embodiment, in accordance with the invention, is largely of the second type but also results in restorative forces most pronounced where fire ball-tube wall spacing is diminished. It entails presence of polyatomic molecular gas species with a radial concentration gradient toward highest concentration in the annular region. Polyatomic is here defined as including diatomic and, in fact, a particular diatomic molecular species—$O_2$ is the preferred embodiment where the fiber glass composition is oxidic.

The remainder of this description is in terms of the preferred embodiment.

The presence of $O_2$ in the ambient results in thermal dissociation to produce nonatomic oxygen. The thermal gradient regardless of whether treated as cause or effect corresponds with a concentration gradient with increasing diatomic oxygen in the radial direction toward the tube wall. The restorative force associated with this concentration gradient of $O_2$ entails exothermic recombination of monoatomic oxygen to yield diatomic oxygen. The resulting hump in the temperature gradient increases the steepness of the gradient immediately adjacent the tube wall. Drive forces associated with the thermal gradient are accordingly enhanced. The presence of $O_2$ in greater abundance in cooler regions approaching the tube wall results in yet other mechanisms lessening the number of ionization events. Increased electron capture cross-section to yield $O_2^-$ lessens the number of ionization events. So, also, does the virtual continuum of vibrational and rotational states within the diatomic molecule. Availability of this continuum yields a mechanism for extraction of electron energy to lower electron temperature and, again, reduces the number of ionization events.

The Zone I requirement of an associated cool wall is met only by constraining the size of the fire ball to result in the annulus as described. A larger fire ball would inherently result in a steeper gradient and necessarily result in centering. Discussion here centers about the need for a constrained fire ball to permit cooling of the wall but must also be centered. In a sense, the annulus is diminished, (a) in the instance of a sheath gas, by "thickening" the wall, or (b) in the instance of monatomic-diatomic gas, by "expanding" the high temperature core region associated with the fire ball. This latter is considered to be the prevalent mechanism for the preferred embodiment in which the fire ball contains monatomic species corresponding with an ambient diatomic species. Other mechanisms depending on reduced population of sufficiently energetic electrons by capture or direct energy absorption need not be considered in this preferred embodiment. Such mechanism/s are, nevertheless, restorative and may satisfy the inventive requirement in this respect.

The preferred embodiment is best attained by use of a plasma which is actually sustained by diatomic ambient yielding ionized species to result in required luminosity. These conditions are considered met when the ionic species within the fire ball are at least 50% of ionized species corresponding with diatomic molecular species in ambient. Despite differences in ionization potential and ion lifetime, the condition is found to be experimentally satisfied by use of an ambient available to the fire ball which contains at least 50% of polyatomic molecular species which may be ionized under the processing conditions.

Tandem Hot Zone (1) This includes the regions within which chemical reaction and smoothing result. It consists of at least two Zones: (1) Zone I defined by an axial core, constituting at least a portion of a fire ball, and a cooler annular region, the outer circumferential surface of which corresponds with a relatively cool inner tube wall at a temperature usually below the glass transition temperature and therefore insufficient for any necessary smoothing and (2) Zone II defined by a region within which the core temperature is lower than that of Zone I; or the core, if hotter than the wall, is of smaller cross section than the core region of corresponding temperature within Zone I, the inner wall surface is at a temperature sufficient to produce any desired layer smoothing. In usual instances, Zone II results in consolidation. Other zones may be included. So, for example, in that embodiment in which there are both leading and trailing wall heaters there may be Zone IIs. Such Zone IIs may be present sequentially or simultaneously. While interzone spacing is not ordinarily desirable, it may result, for example, by reason of apparatus limitations. Physical separation of separate plasma heat source and wall heater may result in a space within the tandem hot zone which meets the requirements neither of Zone I nor Zone II. Relative motion of tandem hot zone and support tube are necessary to the inventive process. In specific embodiments, zone length in the travel direction is substantially constant at least during each half cycle (i.e., during traversal as well as during retraversal). Dimensional variation may be introduced, however, in response to a measurement signal indicating some variation from desired operating parameters; or it may be altered in lieu of or in addition to other parameters to compensate for or to produce thickness change of a deposited layer.

Consolidation

An increase in density realized through void reduction produced by heating. It is contemplated that density increase be by an amount of at least 10%. Consolidation is generally, but not necessarily, realized in Zone II.

Smoothing

Increase in surface smoothness produced by heating in Zone II. The term as here used connotes a lessening in surface roughness to eliminate elevational variations greater than about 1% of layer thickness.

Plasma Heat Source

The radiation source responsible for maintenance of the steady state plasma and therefore responsible for maintenance of Zone I of the tandem hot zone. Under certain circumstances it may be responsible for maintenance of Zone II as well. In many embodiments the source is electrical, e.g., encircling r.f. coils or microwave cavity. Considerations relating, e.g., to tube size to attain Zone I requirements as well as expedient apparatus design suggest a usual preference for r.f. frequencies.

Wall Heater

This is generally but not necessarily a heater distinct from the plasma heat source. As the term connotes, it is designed to produce wall heating—in accordance with this description—to result in attainment at least of the smoothing temperature.

Multimode, e.g., Multimode Fiber

Refers to fiber designedly supporting a plurality of modes of transmitted energy.

Single Mode, e.g., Single Mode Fiber

Refers to fiber designedly supporting only the fundamental mode.

Restricted Mode, e.g., Restricted Mode Fiber

Fiber designedly a designated small number of modes (generally two).

Homogeneous Reaction

Reaction in which material participating in the reaction is of the same phase. For the purposes of the invention, homogeneous reaction entails reaction as between gas phase reactants at a position spaced from the tube wall. The term is intended to distinguish from chemical vapor deposition as usually practiced in these arts in which reaction is heterogeneous—in which reaction takes place at the side wall. Two caveats are noted: (1) wall reaction—conventional heterogeneous reaction—is not precluded, even though, in the usual instance, most reaction is homogeneous and (2) initial homogeneous reaction where resulting in macroscopic particles entails an additional mechanism; in one instance, temperature permitting, wall reaction on the homogeneously formed reaction product or condensation of gaseous molecular product. Consistent with usual practice, the process is considered homogeneous where initial reaction is homogeneous, despite the nature of subsequent processes.

Polyatomic

This term has reference to molecular species usually in the gas phase with each molecule including two or more atoms regardless of the nature of the binding energy. An example constituting the preferred embodiment is a diatomic gas, such as $O_2$.

2. The Drawing

The FIGURE is illustrative of apparatus as utilized in some of the numbered examples. It consists of glass working lathe 1 which includes a head stock chuck 2 and tail stock chuck 3 which together support and provide for rotation of support tube 4 (also known as MCVD tube 4). The FIGURE depicts steady state operation and therefore includes tandem hot zone 5. In the variation shown tandem hot zone 5 includes a Zone I, 6, and a Zone II, 7. Zone I is produced by r.f. heater 8 which during operation supports fire ball 9. Relatively cool wall temperature as required in accordance with the glossary definition is maintaned, in this instance with the aid of water cooling by jets 10. Shield 11 serves as a heat shield and also prevents coolant splashing. Fire ball 9 is as defined in the preceding section. It may form a part of a diatomic gas plasma. In the examples fire ball 9 is an oxygen plasma. Zone II, 7, as shown is, at least in part, produced by discrete wall heater 12 depicted as an oxyhydrogen torch. Operational parameters indicated on the FIGURE correspond with examples and provide for reactant flow 13 from left to right as viewed with tube movement during smoothing from right to left (relative to tandem hot zone) as viewed in accordance with arrow 14. Under these circumstances and in accordance with certain operating parameters used at least in example 1, reaction is initiated within Zone II. This results in particulate reaction product in the gas stream and in particulate deposit 15 which is smoothed—in this instance also consolidated—to vitreous layer 16 during the same traversal cycle. Particulate matter deposited on portions of tube 4 downstream of Zone I is carried to Zone II continuously with the relative flow and tube movement directions depicted.

3. General Procedure

An element common to every embodiment of the invention is described. The tandem hot zone invariably includes a fire ball region centrally located within the tube with the luminous fire ball encompassed by an annulus which is nonluminous or of relatively low luminosity. As described in section 1 of the Detailed Description, the annulus, always visible, is, at least for some distance, of sufficient thickness as to result in tube surface temperature insufficient to finally smooth deposited material. Temperature depends upon a number of factors including glass composition, tube thickness, presence and nature of any cooling fluid, tranverse rate, etc. The inventive process requires a stable centered fire ball which, in most embodiments, is assured by a drive force superimposed on the thermally conductive conditions responsible for the existence of the fire ball.

Zone II as defined in section 1 is necessary to the invention. Zone II, whether produced by discrete heating means or not, is responsible for surface smoothing of layered material (necessary for all but the final layer).

The general procedure is implicit in section 1, and any inconsistencies should be resolved in favor of that section. Where such discrepancy does exist, the relatively narrow description in this section may be considered exemplary. This section is followed by another procedural section which specifies the apparatus and operating parameters used in the examples. Referring to the FIGURE, the tandem heat zone is depicted as having one each of Zones I and II with Zone II upstream of Zone I. Relative tube movement from right to left as viewed results in reaction with Zone I and, at a later time in a traversal, in continuous smoothing of deposited particulate matter also within Zone I. Alternative arrangements implicit in the above include reversal in reactant flow and in interchange of Zones I and II for any direction of reactant flow. These variations are sufficient for descriptive purposes although other variations providing for, e.g., additional zones are set forth in Section 1 of the Detailed Description.

At start-up a plasma is struck usually within an easily ignited ambient, e.g., argon; and gas flow composition is changed in the direction of steady state, e.g. to result in oxygen or other diatomic gas plasma. Reactant material, which for a silica-based glass, may consist of chlorides, e.g., $SiCl_4$, $GeCl_4$, $POCl_3$, together with oxygen, are introduced; and reaction—generally predominantly homogeneous (i.e. at position spaced from the tube wall)—results. Regardless of the design nature of the heating apparatus, drive forces ascribed to the centrally located fire ball result in deposition of reacted material. Depending upon specific conditions and apparatus design, deposition may be largely on the surface defined by the annulus about the fire ball although deposition may also take place downstream of Zone I. Where Zone I is upstream of Zone II, reaction is brought about largely as a result of Zone I. In such instance, chemical combination, generally not permitted at the high maximum temperatures attained in the fire ball, takes place outside an isotherm appropriate to the composition. Depending upon, inter alia flow conditions and reactant composition, reaction may be primarily at the leading upstream of the fire ball. Further reaction may occur in the annulus and downstream of the fire ball as well.

Where a Zone II is upstream of Zone I, reaction may be similar to that of flame MCVD. Resulting particulate material is further heated within Zone I which also promotes effective deposition through forces ascribed to thermophoresis.

While the above is reasonably consistent with observation, it is acknowledged that (1) some heterogeneous wall reaction necessarily results under most conditions and (2) homogeneous reaction, while likely controlling under all circumstances, may result in (a) small particles which are not observable to the unaided eye and (b) gaseous or liquid fluid state product. Under certain permitted reaction conditions, particularly where reactant material is introduced directly into Zone I, reaction product in the form deposited may result only from condensation of initial vapor phase reaction product. Whether reaction product is deposited in the physical for initially resulting from reaction or from subsequent condensation, observation supports the postulate that deposited product may be liquid under some conditions.

Deposited matter is smoothed largely by Zone II. Depending upon the nature of the deposit, Zone II may serve the additional functions of consolidating and/or fining. In any event, temperatures attained at the inner tube wall in Zone II are necessarily sufficient for fusion.

Deposition and smoothing results in core material and generally in some encompassing material as well. MCVD practice at this time includes deposition of a "barrier layer" designed to serve as a barrier to diffusing contaminant from the support tube into the core. In accordance with usual practice, the barrier is characterized by a thickness of a small number of micrometers and by a refractive index less than that at least of the maximum index of the core. Barrier composition is usually chosen to yield a refractive index similar to that of the clad.

Upon completion of deposition and smoothing, support tube and deposited layer(s) are usually collapsed, generally to produce a solid rod preform. While gas flow composition is generally altered during collapse, retained circularity during collapse may be assured by maintaining gas flow or otherwise providing for a positive pressure within the tube. Undesired compositional variations such as loss of volatiles may be minimized by deliberate inclusion of reactant or other suitable active ingredients.

Fiber is produced by heating a tip of the preform to drawing temperature and by drawing. To prevent surface damage and preserve inherently high strength, drawn fiber is coated by one or more layers of material of appropriate modulus prior to contact with reel, mandrel, or other solid surface. The general procedures of collapse, draw and coating are described in Chapter 9, *Optical Fiber Telecommunications,* edited by S. E. Miller and A. G. Chynoweth, Academic Press (1979). The entire text is, however, relevant to this disclosure and is incorporated by reference.

Many operational variations are permitted. For example, operation may be in usual terms of: a functional transversal and rapid retraversal, with major reaction, deposition, and smoothing all during traversal; all functions may occur during both traversal and retraversal; or functions (reaction-deposition and smoothing) may be divided between traversal and retraversal (likely at similar velocities). Combinations are also comtemplated so, e.g., all functions may occur during traversal with additional smoothing during retraversal. Variations in gas reactant composition and/or flow, in temperature, in relative traversal and retraversal rates, etc., may permit compensation for processing variables to produce unvarying fiber characteristics, or to produce deliberate variation in fiber characteristics.

For convenience, certain operational variations, which are the subject of appended claims, are set forth:

(a) The composition of the vapor mixture is altered at least once with such alteration resulting in glassy deposit of changed index of refraction for energy of wavelength to be transmitted.

(b) The alteration of the vapor mixture is designed to increase the index.

(c) The alteration includes a step-wise change.

(d) The enumerated steps of paragraph (a) are repeated.

(e) The enumerated steps of paragraph (b) are repeated so that the alteration in vapor mixture to increase index is repeated.

(f) The steps enumerated in paragraph (c) are repeated (i.e., there is at least a second step-wise change).

(g) The enumerated steps described for fabrication of a glass fiber as generally described are repeated a plurality of times. Such repetition is applied to all processing steps applied to fabrication of a preform, e.g., to those as described in paragraphs (d), (e), and (f).

(h) The process as described in paragraph (g) described in terms of traversal at a first relative average velocity and retraversal at a second average velocity is operated at such velocities at unequal values of relative movement.

(i) Process as described in paragraph (h), however, in which relative movement during traversal and retraversal is at equal average velocity.

(j) The process in which enumerated steps are repeated, e.g., as described in paragraphs (d), (e), or (f), is operated under conditions in which the hot zone temperature is increased after at least a traversal so as to result in at least partial collapse of the tube.

(k) The process of paragraph (j) is conducted with temperature increase resulting at least in part from decreased velocity of the moving stream.

(l) The process of paragraph (j) is carried out with the plasma extinguished during at least a portion of collapse.

(m) The process of paragraph (j) is conducted under conditions to result in complete collapse to produce a solid preform structure.

(n) The solid preform structure of paragraph (m) is drawn to reduce cross-section and to produce a fiber.

(o) The process in which enumerated steps are repeated, e.g., as described in paragraphs (d), (e), and (f), is carried out under conditions such that deposit is at a rate of at least 1 gram per minute.

EXAMPLES

The procedure used in the examples is described: The substrate tube is mounted in the headstock and tailstock chucks of a glassworking lathe. The headstock and tailstock are mechanically coupled and motor driven. Chucks are designed to permit movement of the substrate tube through the chucks and to accommodate a stationary r.f. coil assembly. Both plasma and reactant vapor enter the substrate tube from the left end via a flexible, heated tube. Reactant vapors are delivered from a conventional MCVD bubbler assembly (see *Bell System Technical Journal* 1723-34 (1978)), which is maintained at 40.7° C., through heated stainless steel lines. Plasma gas flows, oxygen and/or argon, are adjusted so that the composition of the gas stream can be varied without altering the total flow rate. A deflecting element in the left (inlet) end of the substrate tube spreads the flowing gases to fill the inside of the tube.

Heat for consolidating (or sintering) the deposited particle layers to produce clear void-free glass within a Zone II is provided by a four-burner torch assembly mounted to the left (upstream) of the r.f. coil assembly. The r.f. induction coil consists of four turns of 3/16 inch O.D. copper tubing wrapped on a 52 mm dia. mandrel with 6 mm space between turns. R.f. power is supplied by a 30 kw generator operated at 3-7 Mhz. The coil is cooled by internally recirculating water. A 10 cm diam. fused silica shield tube, baffled at both ends, surrounds both the r.f. coil and substrate tube. Distilled water flows at ½ l/min. through ports on the 10 cm tube and continuously cools the surface of the substrate tube in the plasma region. The surface temperature of the substrate tube, in the region heated by the oxyhydrogen torch, is continuously monitored by an optical pyrometer.

Preforms are prepared by using the following procedure: Delivery lines are preheated to ~50° C.; reactant flows are brought to equilibrium and vented while the bubblers are brought to temperature. A cleaned substrate tube with the gas diffuser plug (or deflecting element) mounted in one end is inserted through the tailstock, r.f. coil assembly, and into the headstock chuck. The tube is then held by the headstock chuck while alignment procedures are carried out to minimize rotational runout. Once aligned, the tube is locked in both chucks and purged for several minutes with argon while the oxyhydrogen torch is ignited at low fuel flows. A graphite rod, held in an insulating handle, is then inserted through the bore of the substrate tube into the region of the r.f. coil while avoiding rod-tube contact. Argon flow is adjusted to 7.0 l/min., and the r.f. power level is increased to initiate the plasma.

Subsequent to plasma ignition the graphite rod is removed; translation and rotation of the substrate tube are begun; cooling water flow is begun; and the r.f. power level is adjusted to ~3.5 kw. The plasma is then switched over to pure oxygen resulting in central positional stabilization of the fire ball. During changeover, the output power of the r.f. generator is increased to about 16 kw. The now stabilized fire ball is in the center of the tube and is enveloped by a nonluminous annulus bound by the tube wall. Fuel flow through the oxyhydrogen torch is then increased to bring the substrate tube temperature to ~1500° C. as it passes over the stationary torch. At this point reactant vapor mixture is added to the plasma gas flow, and deposition commences. The substrate tube at this point is moving slowly (15 cm/min.) to the left so that the deposited particle layer leaves the plasma zone (Zone I) and enters the region heated by the oxyhydrogen torch (Zone II) in which the deposit is sintered to a clear glass layer ~50 μm thick. At the end of the deposition pass, the substrate tube is rapidly returned to the right, and another deposition pass is begun.

At the end of deposition, the plasma, water flow, and reactants are shut off; traverse is slowed, and fuel flow to the oxyhydrogen torch is increased to collapse the tube as conventionally practiced in MCVD.

Examples 1 through 5 presented in tabular fashion in the table followed this procedure. The examples are representative of production of two types of product; the first, a multimode fiber drawn from a preform produced by: deposition of a barrier in accordance with example 1; a core in accordance with example 2; and collapse in accordance with example 5: and the second; a single mode fiber prepared from a preform made by producing clad in accordance with example 3; core in accordance with example 4; and collapse in accordance with example 5.

The tabulated examples were conducted largely to establish feasibility of preparation of high throughput preforms to yield reasonable insertion loss fiber. Fiber so prepared in early experiments had insertion loss of less than 5 dB/km at a transmission wavelength of 0.82 μm. Deposition rates were about 2.5 gms/min.

TABLE I

| | Examples | # of Passes | $SiCl_4$ gm/min | $BCl_3$ cc/min | $GeCl_4$ gm/min | $POCl_3$ gm/min | $O_2$ l/min | Traverse rate cm/min |
|---|---|---|---|---|---|---|---|---|
| | Multimode | | | | | | | |
| 1 | Barrier | 7 | 6 | 16 | | .2 | 7 | 17 |
| 2 | Core | 14 | " | | 0 to 1.0 | " | " | 15 |
| | Single mode | | | | | | | |
| 3 | Clad | 15 | " | " | | .3 | " | 17 |
| 4 | Core | 2 | 3 | | .6 | .4 | " | 5 |
| 5 | Collapse | 6 | | | | | .01 | 1 |

Other experiments not presented as numbered examples established feasibility of higher deposition rates as well as a range of procedures to produce the various structures suitable to production by flame MCVD. Whether or not inventive embodiments represent true MCVD species, contemplated procedures are capable of the flexibility associated with MCVD. Accordingly, control of individual layer composition and thickness permit detailed profiling. As in flame MCVD, the preform with or without total collapse may be enlarged by overcladding in accordance with a rod and tube technique or by simultaneous or subsequent outside deposition, for example, of hydrolysis product (or "soot"). As in flame MCVD, layer-by-layer control oftentimes significant may yield to single pass processing, for example, in fabricating a fine dimensioned single mode core. In usual practice at this time, however, single pass deposition/smoothing is not practiced since deposition of both core and barrier has, to date, been required for preparation of long-haul, low insertion loss, fiber.

As in flame MCVD, perturbed or changing deposition rates of deposit composition may be introduced to produce corresponding perturbations or change, or to compensate for layer thickness tapering, or generally to compensate for processing fluctuations. Variation may be manual or automated.

5. General Considerations

It has been noted that a significant aspect of the advance represented by the invention involves the nature of the plasma fire ball. Regardless of whether reactant introduction is initiated in Zone I or Zone II, the fire ball is centered within an annulus of reduced luminosity. In the preferred embodiment it is that of an oxygen plasma or other nonmonatomic gas plasma, and this facilitates maintenance in a central position of the support tube. While a variety of parameters may influence design, the need to maintain the luminous fire ball at a position spaced from the wall (i.e., the need to maintain an enveloping annulus) imposes restrictions on tube dimensions. In the procedures resulting in the tabulated examples, it was found desirable to maintain an annulus thickness of at least 0.5 cm and preferably 1.0 cm. This minimum thickness is desired to prevent significant loss of material already deposited and to minimize tube distortions.

It was found that a variety of processing parameters affect plasma positioning. These include plasma gas composition always relative to total gas composition (including reactant), frequency of the plasma generator as well as tube radius, $r_t$ (increasing frequency and radius favor stability). Under conditions studied with a fire ball radius $r_f$ of about 0.75 cm, centering is noncritical if $r_t - r_f > 1$ cm.

Most importantly, centering was found to be a function of plasma gas composition. The position stabilization of the plasma upon switchover from the initiating argon ambient to the steady state oxygen ambient is dramatic.

Centering of the fire ball becomes less critical at higher generator frequency. The annulus requirement imposes a need for a minimum tube diameter. The minimum power required to maintain the fire ball in turn imposes a dimensional limitation on the fire ball diameter. Increasing frequency permits maintenance of a smaller fire ball with increasing stability. Since decreasing fire ball diameter does not necessarily result in a linearly increasing stability, choice of frequency is determined with a view to efficiency of power injection. For the apparatus used in the numbered examples, most efficient operation was at a frequency of about 5 MHz.

In the experiments reported, zone II resulted in further smoothing of layers as emerging from zone I. Other functions performed by zone II include annealing to result in any thermal stress. Required wall temperature above the glass transition temperature (usually defined as corresponding with a viscosity of about 13.1 poise) may also result in elimination of any occluded gas. Both effects may contribute to improved quality of the final fiber. From a generic standpoint, either or both effects may constitute the major or only contribution to already deposited material. Accordingly, deposited material as departing zone I may already be at the required surface smoothness.

We claim:

1. Process for fabrication of a glass fiber optical transmission line comprising a core section and a cladding wherein the cladding has an index of refraction of a value lower than the maximum index of the core for energy of the wavelength to be transmitted, which comprises introducing a moving stream of a vapor mixture including at least one compound glass forming precursor together with an oxidizing medium into a tube while heating the tube so as to react the said mixture to deposit reacted mixture so as to produce a smooth glassy deposit on the inner surface of the tube, in which heating of tube and contents are by a hot zone which moves relative to the tube, the hot zone being produced by a corresponding heat source external to the tube, the said heat source comprising a plasma generator for producing a fire ball within the said vapor mixture within the tube, characterized in that the said hot zone is a tandem hot zone including at least two zones; one designated Zone I and another designated Zone II in which Zone I is generated primarily by the said fire ball and has a central region at a fire ball temperature and an enveloping inner tube wall at a temperature below the glass transition temperature of the deposit and in which Zone II is defined by that zone within which the inner tube surface is at a temperature above the said glass transition temperature.

2. Process of claim 1 in which deposition of reacted mixture and smoothing of the deposit are sequential with at least some smoothing being in Zone II.

3. Process of claim 1 or 2 in which at least 50 percent by volume of the vapor mixture is polyatomic with the term "polyatomic" defined as including diatomic.

4. Process of claim 1 in which the said oxidizing medium constitutes at least 50 percent by volume of the vapor mixture.

5. Process of claim 1 in which the said oxidizing medium consists essentially of oxygen.

6. Process of claim 1 in which the said plasma is an oxygen plasma.

7. Process of claim 1 in which the moving heat source includes a wall heater and in which Zone II corresponds with such wall heater.

8. Process of claim 1 in which the said plasma generator is an r.f. generator.

9. Process of claim 1 in which the said fire ball is enveloped by a less luminous (defined as including nonluminous) annular region which prevents contact of the tube wall by the fire ball.

10. Process of claim 1 in which the said vapor mixture includes a silicon bearing compound as a glass compound precursor.

11. Process of claim 10 in which an oxidizing medium is oxygen.

12. Process of claim 1 in which reaction of the said mixture is primarily homogeneous.

13. Process of claim 12 in which the said homogeneous reaction produces condensed reaction product prior to deposition.

14. Process of claim 13 in which the said condensed reaction product as deposited is particulate and in which the deposited particulate matter is consolidated by the said moving heat source.

15. Process of claim 1 in which Zone II is upstream of Zone I with reference to the said moving stream.

16. Process of claim 1 in which Zone II is downstream of Zone I with reference to the said moving stream.

17. Process of claim 1 in which the said tube is rotated.

18. Process of claim 1 in which the composition of the said vapor mixture is altered at least once with such alteration resulting in glassy deposit of changed index of refraction for energy of wavelength to be transmitted.

19. Process of claim 18 in which such alteration designedly increases the said index.

20. Process of claim 19 in which alteration includes a step-wise change.

21. Process of claims 4, 5, 6, 7, 8, 9, 10, 11, 12, 13, 14, 15, 16, 17, 18, 19, or 20, in which the enumerated steps are repeated.

22. Process of claim 21 in which the said steps are repeated a plurality of times.

23. Process of claim 22 in which relative movement is described in terms of a traversal at a first relative average velocity and retraversal at a second relative average velocity and in which the said average velocities are unequal.

24. Process of claim 22 in which relative movement is described in terms of a traversal at a first relative average velocity and retraversal at a second relative average velocity and in which the said average velocities are equal.

25. Process of claim 21 in which the hot zone temperature is increased after at least a traversal so as to result in at least partial collapse of the said tube.

26. Process of claim 25 in which temperature increase is at least in part produced by decreased velocity of the said moving stream.

27. Process of claim 25 in which the said plasma is extinguished during at least a portion of the said collapse.

28. Process of claim 25 in which the tube together with deposit is completely collapsed to produce a solid preform structure.

29. Process of claim 28 in which the said preform structure is drawn to reduce cross section and thereby to produce a fiber.

30. Process of claim 21 in which the composition of the said vapor mixture, the velocity of the said moving stream, and other conditions are such that deposit is at a rate of at least 1 gram/min.

* * * * *